US005598129A

United States Patent [19]
Chambers

[11] Patent Number: 5,598,129
[45] Date of Patent: Jan. 28, 1997

[54] LOW CURRENT DRAIN OPERATIONAL TRANSCONDUCTANCE AMPLIFIER

[75] Inventor: Mark J. Chambers, Gilbert, Ariz.

[73] Assignee: Motorola, Inc., Schaumburg, Ill.

[21] Appl. No.: 518,935

[22] Filed: Aug. 24, 1995

[51] Int. Cl.[6] .................................................. H03F 3/45
[52] U.S. Cl. .......................... 330/255; 330/253; 330/254; 330/257; 330/260
[58] Field of Search .................................. 330/146, 253, 330/254, 255, 257, 260

[56] References Cited

U.S. PATENT DOCUMENTS

| | | | |
|---|---|---|---|
| 4,897,612 | 1/1990 | Carroll | 330/253 |
| 4,912,423 | 3/1990 | Milkovic et al. | 330/9 |
| 5,028,881 | 7/1991 | Jackson | 330/253 |
| 5,323,120 | 6/1994 | Ryat | 330/252 |
| 5,363,061 | 11/1994 | Barrett, Jr. et al. | 330/288 |
| 5,382,838 | 1/1995 | Sasaki et al. | 327/108 |
| 5,392,003 | 2/1995 | Nag et al. | 330/254 |
| 5,404,097 | 4/1995 | Barou | 330/260 X |

OTHER PUBLICATIONS

Hogervost et al., "FA 14.1: A Compact Power–Efficient 3V CMOS Rail–to–Rail Input/Output Operational Amplifier for VLSI Cell Libraries", *IEEE International Solid–State Circuits Conference*, 1994, pp. 244–245.

Willingham et al., "A BiCMOS Low–Distortion 8–Mhz Low–Pass Filter", *IEEE Journal of Solid–State Circuits*, vol. 28, No. 12, pp. 1234–1245, Dec. 1993.

*Primary Examiner*—James B. Mullins
*Attorney, Agent, or Firm*—John G. Rauch

[57] ABSTRACT

An operational transconductance amplifier (500) includes an input stage (502) having a first and second amplifiers (504, 508) driving class-AB, push-pull amplifiers (506, 510). The input stage (502) receives a differential input signal at first and second amplifier inputs (528, 540). The push-pull amplifiers (506, 510) establish differential currents in a transconductance-setting resistor (512), thereby eliminating the need for static current sources. The biasing levels established by the first and second amplifiers (504, 508) to drive the push-pull amplifiers (506, 510) also control a current source (514). Currents from the current source (514) are summed and provided to amplifier outputs (594, 596).

17 Claims, 4 Drawing Sheets

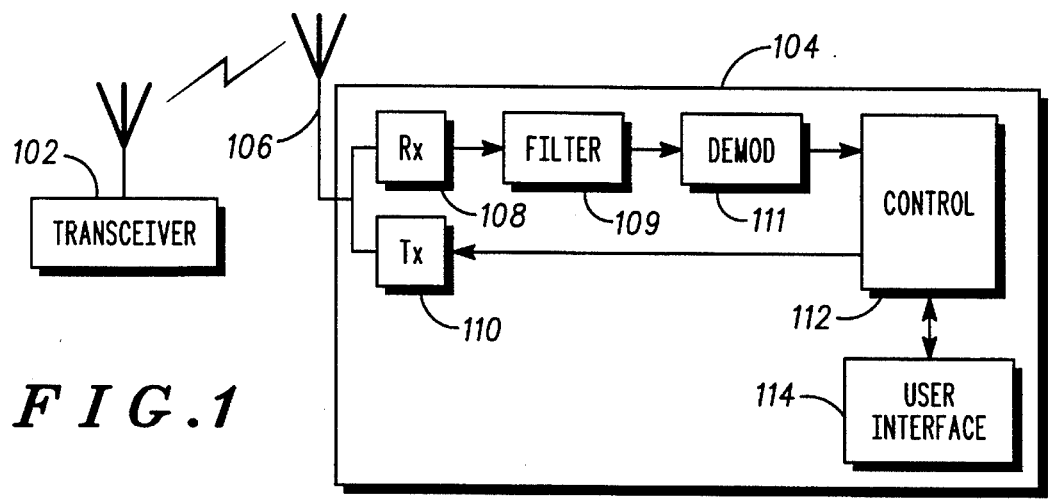
FIG.1
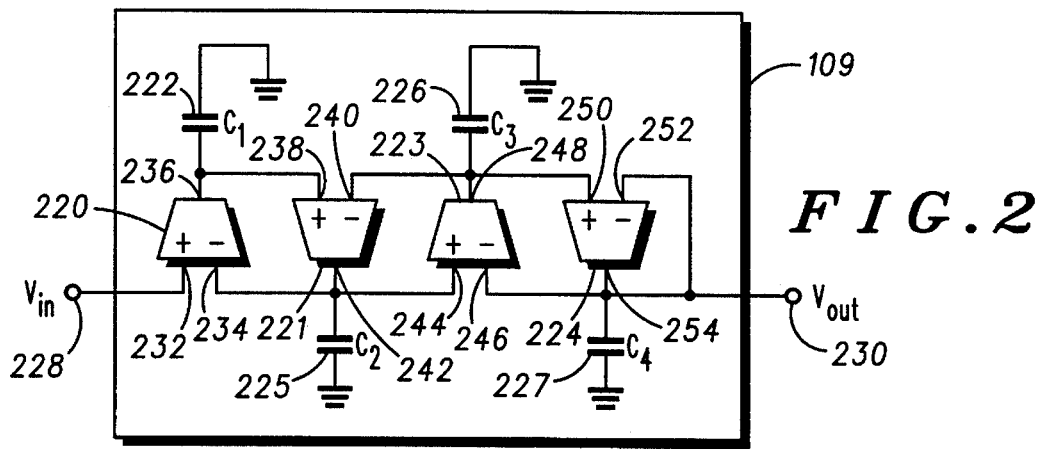
FIG.2
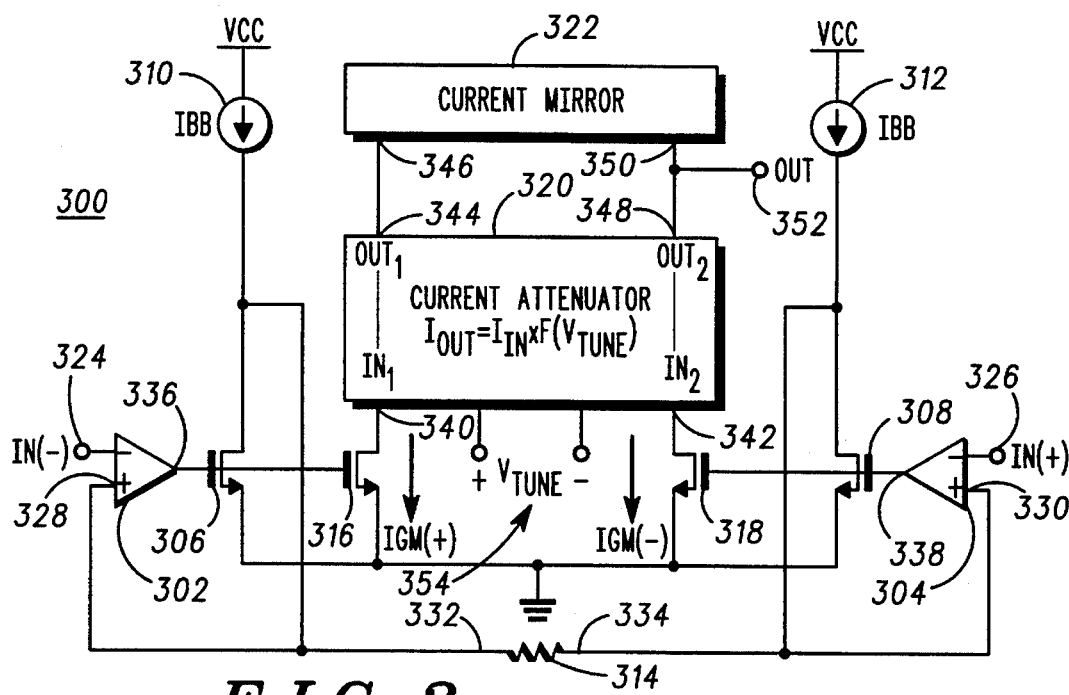
FIG.3 —PRIOR ART—

5,598,129

LOW CURRENT DRAIN OPERATIONAL TRANSCONDUCTANCE AMPLIFIER

FIELD OF THE INVENTION

The present invention generally relates to electronic amplifier circuits and, in particular, to an operational transconductance amplifier having reduced current drain.

BACKGROUND OF THE INVENTION

An operational transconductance amplifier (OTA) is a circuit that produces an output current proportional to a differential input voltage. The ratio of the output current to the input voltage is the transconductance, $g_m$, of the amplifier. OTAs may have different values of $g_m$ suited for different applications. Also, the output signal (current) amplitude may be tailored to suit a particular application.

OTAs have many applications including telecommunications. For example, OTAs are used for providing functions such as baseband filtering or signal level regulation. A complex telecommunications circuit may include many OTAs configured to provide a variety of functions.

Other applications for OTAs include portable telecommunications products, such as radiotelephone handsets. A radiotelephone handset is a portable radio that may communicate with one or more radiotelephone base stations according to a predetermined telecommunications protocol. Electrical power for the radiotelephone handset is provided by a battery.

Radiotelephone handsets are typically designed to be physically small in size and with minimal power dissipation to increase battery life. These design goals enhance the portability of the handset.

To reduce handset size, the circuitry that provides the handset's functionality is constructed using highly integrated circuits. Typical integrated circuit fabrication processes provide bipolar and field effect transistors, resistors, capacitors and other circuit elements. These elements are combined to provide higher levels of functionality, such as amplification stages, current sources, etc.

To reduce power dissipation, static and dynamic currents in the radiotelephone handset control circuitry are reduced. Static currents may include active current sources used to establish voltage and other levels in the circuit. Generally, the extent to which static current levels may be reduced is limited by performance requirements of the circuit. For example, in an OTA, operational parameters such as frequency response and peak output signal amplitude may be reduced to unacceptable levels as static current levels are reduced.

Therefore, there is a need for an operational transconductance amplifier circuit having reduced current drain relative to prior art operational transconductance amplifier circuits but without a reduction in performance parameters. Further, there is a need for such an operational transconductance amplifier circuit suitable for use with a radiotelephone handset.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction the accompanying drawings, in the several figures of which like reference numerals identify identical elements, and wherein:

FIG. 1 is an illustration in block diagram form of a radiotelephone communication system which may employ the present invention;

FIG. 2 is an illustration in block diagram form of a filter which may employ the present invention;

FIG. 3 is a circuit diagram in partial block diagram form illustrating a prior art operational transconductance amplifier;

DESCRIPTION OF THE PREFERRED EMBODIMENTS

Figure 4:
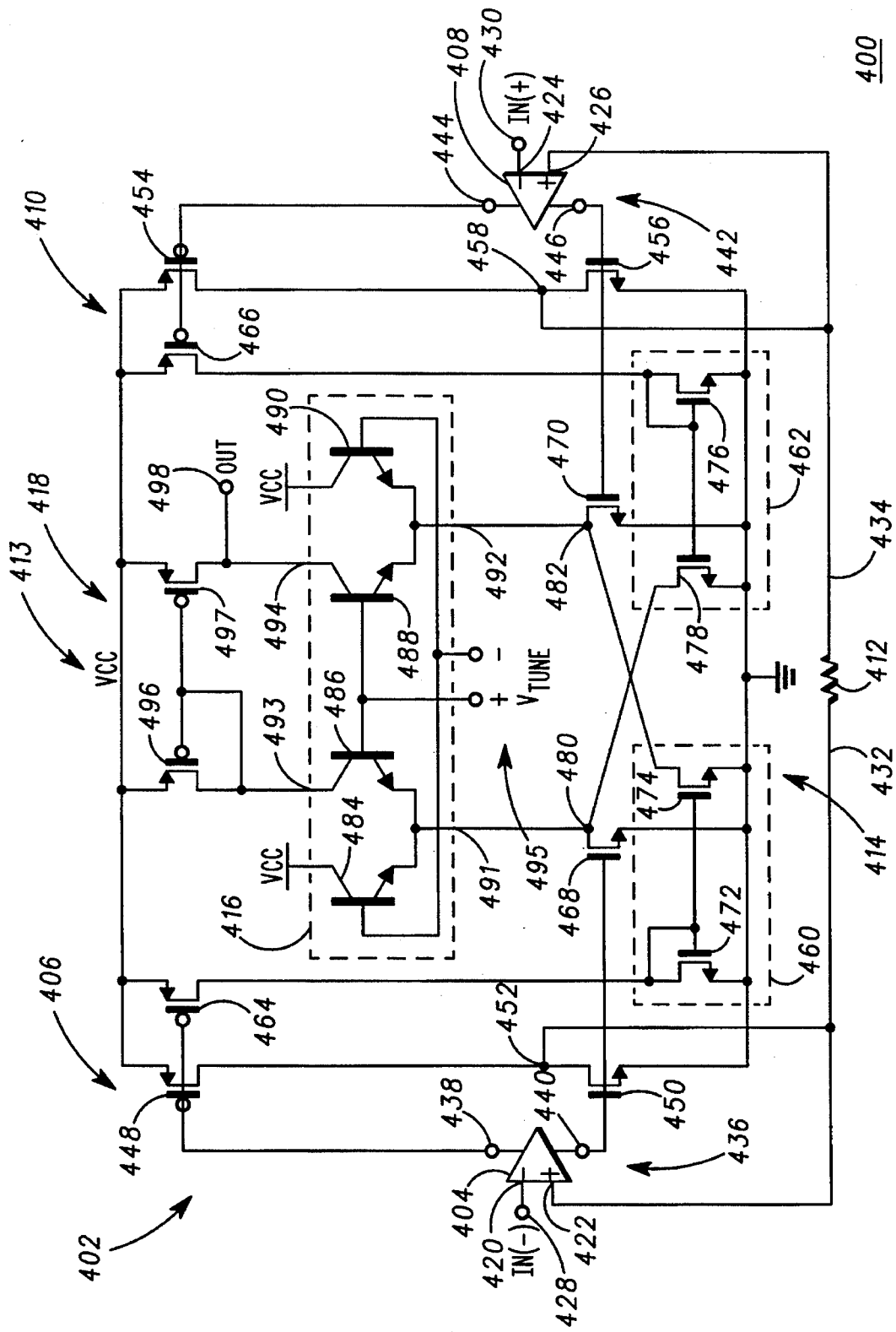
FIG. 4 is a circuit diagram and partial block diagram form illustrating an operational transconductance amplifier according to the present invention.

FIG. 1 is an illustration in block diagram form of a radiotelephone communication system 100. The radiotelephone communication system 100 includes a remote transceiver 102 and one or more radiotelephone handsets such as radiotelephone handset 104. The remote transceiver 102 sends and receives radio frequency (RF) signals to and from radiotelephone handsets within a fixed geographic area. The radiotelephone handset 104 is one such radiotelephone handset contained within the geographic area. The radiotelephone handset 104 includes an antenna 106, a receiver 108, a filter 109, a transmitter 110, a demodulator 111, a controller 112 and a user interface 114.

Upon reception of RF signals, the radiotelephone handset 104 receives the RF signals through the antenna 106. The antenna 106 converts the received RF signals into electrical baseband signals. The filter receives the electrical baseband signals from the antenna and filters the electrical signals to produce filtered electrical signals. The demodulator 111 demodulates the filtered electrical baseband signals and recovers the data transmitted on the RF signals and outputs the data to the controller 112. The controller 112 formats the data into recognizable voice or information for use by user interface 114. The user interface 114 communicates the received information or voice to a user. Typically, the user interface includes a display, a keypad, a speaker and a microphone (not shown).

Upon transmission of radio frequency signals from the radiotelephone handset 104 to the remote transceiver 102, the user interface 114 transmits user input data to the controller 112. The controller 112 typically includes a microprocessor, memory, and a power amplifier control circuit (not shown). A controller 112 formats the information obtained from the user interface 114 and transmits it to the transmitter 110 for conversion into RF modulated signals. The transmitter 110 conveys the RF modulated signals to the antenna 106 for transmission to the remote transceiver 102.

FIG. 2 is an illustration in block diagram form of the filter 109 of the radiotelephone handset 104 of FIG. 1. The filter 109 includes operational transconductance amplifiers 220, 221, 223 and 224 and capacitors 222, 225, 226 and 227. The filter has a filter input 228 and a filter output 230.

Operational transconductance amplifier (OTA) 220 has a first input 232, a feedback input 234 and an output 236. The first input 232 is coupled to the filter input 228. Capacitor 222 is coupled between the output 236 and ground potential. OTA 221 has a first input 238, a feedback input 240 and an output 242. The first input 238 is coupled to the output 236 of OTA 220. The output 242 is coupled to the feedback input 234 of OTA 220. Capacitor 225 is coupled between the output 242 and ground potential.

OTA 223 has a first input 244, a feedback input 246 and an output 248. The first input 244 is coupled to the output 242 of OTA 221. The output 248 is coupled to the feedback input 240 of OTA 221. Capacitor 226 is coupled between the output 248 and ground potential. OTA 224 has a first input 250, a feedback input 252 and an output 254. The first input 250 is coupled to the output 248 of the OTA 223. The feedback input 252 is coupled to the output 254. The output 254 is coupled to the feedback input 246 of OTA 223 and to the filter output 230. Capacitor 227 is coupled between the output 254 and ground potential.

The filter 109 receives signals at the filter input 228, filters the signals and provides filtered signals at the filter output 230. The transfer characteristic of the filter is controlled by the values of the capacitors 222, 225, 226, 227 and by the operational characteristics of the individual operational transconductance amplifiers 220, 221, 223, 224. Other filter topologies using one or more OTA circuits may also be used to implement the filtering function for the radiotelephone handset 104 of FIG. 1.

FIG. 3 is a circuit diagram in partial block diagram form illustrating a prior art operational transconductance amplifier (OTA) 300. The OTA 300 includes a first input amplifier 302, a second input amplifier 304, a first n-channel transistor 306, a second n-channel transistor 308, a first current source 310 and a second current source 312, a resistor 314, a third n-channel transistor 316, a fourth n-channel transistor 318, a current attenuator 320 and a current mirror 322.

The first input amplifier 302 has a first input 324 and the second input amplifier 304 has a second input 326 for receiving a differential input signal. In addition, the first input amplifier 302 has a feedback input 328 connected to a first end 332 of the resistor 314. The second input amplifier 304 has a feedback input 330 coupled to the second end 334 of the resistor 314.

The first n-channel transistor 306 has a gate coupled to an output 336 of the first input amplifier 302. The second n-channel transistor 308 has a gate coupled to the output 338 of the second input amplifier 304. The sources of both the first n-channel transistor 306 and the second n-channel transistor 308 are coupled to ground potential. The drain of the first n-channel transistor 306 is coupled to the first current source 310 and receives a reference current generated by the first current source 310. Similarly, the drain of the second n-channel transistor 308 is coupled to the second current source 312 and receives a reference current generated by the second current source 312.

The third n-channel transistor 316 has a gate which is also coupled to the output 336 of the first input amplifier 302. The fourth n-channel transistor 318 has a gate coupled to the output 338 of the second input amplifier 304. The sources of both the third n-channel transistor 316 and the fourth n-channel transistor 318 are coupled to ground potential. The drain of the third n-channel transistor 316 is coupled to a first input 340 of the current attenuator 320. The drain of the fourth n-channel transistor 318 is coupled to a second input 342 of the current attenuator 320.

The current attenuator has a first output 344 coupled to an input 346 of the current mirror 322 and a second output 348 coupled to the output 350 of the current mirror. The output 350 of the current mirror is coupled to the output 352 of the OTA 300.

The nominal transconductance $g_m$ of OTA 300 is established by the resistor 314 along with first input amplifier 302 and second input amplifier 304. The first current source 310 and the second current source 312 are static current sources providing substantially time invariant currents to the first n-channel transistor 306 and the second n-channel transistor 308, respectively. These currents are each labeled $I_{BB}$ in FIG. 3. The conductivity of the first n-channel transistor 306 varies according to the signal received from the output 336 of the first input amplifier 302. Similarly, the conductivity of the second n-channel transistor 308 varies according to the signal received from the output 338 of the second input amplifier 304. As the respective conductivities of first n-channel transistor 306 and second n-channel transistor 308 vary, the respective currents conducted by each of these transistors varies proportionally.

Since the gate-to-source voltage of the third n-channel transistor 316 is substantially the same as the gate-to-source voltage of the first n-channel transistor 306, the third n-channel transistor 316 will conduct substantially the same current as the first n-channel transistor 306. This current is labeled $Ig_m(+)$ in FIG. 3. Similarly, since the gate-to-source voltage of the fourth n-channel transistor 318 is substantially the same as the gate-to-source voltage of the second n-channel transistor 308, the fourth n-channel transistor 318 will conduct substantially the same current as the second n-channel transistor 308. This current is labeled $Ig_m(-)$ in FIG. 3. The current $Ig_m(+)$ is provided to the first input 340 of the current attenuator 320. The current $Ig_m(-)$ is provided to the second input 342 of the current attenuator 320.

The current attenuator 320 has a tuning input 354 to permit transconductance tuning. The current attenuator 320 has the following transfer characteristic relating the current at first output 344 to the current at first input 340 and the current at second output 348 to the current at second input 342:

$$I_{out}=I_{in}\times f(V_{tune}), \text{ where } 0 < f(V_{tune}) \leq 1$$

In this case, $f(V_{tune})$ is some arbitrary function determined according to the performance requirements of the OTA 300.

The current mirror 322 functions to sum the currents received from the current attenuator 320. The current provided to the output 352 of the OTA 300 is thus a sum of the two currents provided by the current attenuator 320.

This prior art OTA 300 is a class-A biased design. The OTA 300 uses DC bias currents $I_{BB}$ from the first current source 310 and the second current source 312 to establish nominal currents in the first n-channel transistor 306 and the second n-channel transistor 308, respectively. To prevent saturation of the first n-channel transistor 306 and the second n-channel transistor 308, the large-signal current swing for these transistors must be less than $I_{BB}$. As an example, assuming a peak input differential voltage applied to first input 324 and second input 326 of 1.0 volts and a value of 20 kΩ for resistor 314 (for a nominal $g_m$ of 50 μA per volt), the peak current swing in the first n-channel transistor 306 and the second n-channel transistor 308 is 50 μA. Thus, the value for the current $I_{BB}$ must be greater than 50 μA. This results in a total current drain of more than 200 μA for OTA 300. For applications such as the radiotelephone handset 104 of FIG. 1, which use a large number of OTAs, such as OTA 300, this level of static current dissipation is unacceptably high.

Referring now to FIG. 4, it shows a circuit diagram in partial block diagram form illustrating an operational transconductance amplifier 400 according to the present invention. The amplifier 400 includes an input stage 402 including a first amplification stage or first amplifier 404 and a second amplification stage or second amplifier 408, a push-pull amplification stage or class-AB amplification stage 406 and a second push-pull amplifier or second class-AB amplifier 410. The transconductance of the amplifier 400 is set by a resistive element or resistor 412. If the amplifier 400 is fabricated in a monolithic integrated circuit, the resistor 412 may formed from a diffused or implanted layer of resistive material such as silicon, from a deposited layer of material such as polysilicon or any other appropriate material. The amplifier 400 further includes a current source 414 and an output stage in the form of a current summer 413 including a current attenuator 416 and a current mirror 418.

The first amplifier 404 includes a first input 420 and a feedback input 422. Similarly, the second amplifier 408 includes a first input 424 and a feedback input 426. The first input 420 of the first amplifier 404 is coupled to a first amplifier input 428 of the amplifier 400, and the first input 424 of the second amplifier 408 is coupled to a second amplifier input 430 of the amplifier 400. Thus, the amplifier 400 is configured to receive a differential input signal at the first amplifier input 428 and the second amplifier input 430.

The feedback input 422 of the first amplifier 404 is coupled to a first end 432 of the resistor 412. Similarly, the feedback input 426 of the second amplifier 408 is coupled to a second end 434 of the resistor 412. The first amplifier 404 has a first differential output 436 including a first output 438 and a second output 440 for providing a first differential output signal. Similarly, the second amplifier 408 has a second differential output 442 including a first output 444 and a second output 446 for providing a second differential output signal. Structure and operation of the first amplifier 404 and the second amplifier 408 will be discussed below in conjunction with FIG. 6.

The first class-AB amplifier 406 includes a p-channel transistor 448 and an n-channel transistor 450. The gate of the p-channel transistor 448 is coupled to the first output 438 of the first amplifier 404 and the gate of the n-channel transistor 450 is coupled to the second output 440 of the first amplifier 404. The drains of the p-channel transistor 448 and the n-channel transistor 450 are each coupled to output 452 of the first class-AB amplifier 406. The output 452 is coupled to the feedback input 422 of the first amplifier 404. In this manner, the first amplifier 404 and the first class-AB amplifier 406 are coupled in a unity gain configuration.

Similarly, the second class-AB amplification 410 includes a p-channel transistor 454 and an n-channel transistor 456. The gate of the p-channel transistor 454 is coupled to the first output 444 of the second amplifier 408, and gate of the n-channel transistor 456 is coupled to the second output 446 of the second amplifier 408. The drains of the p-channel transistor 454 and the n-channel transistor 456 are each coupled to output 458 of the second class-AB amplifier 410. The output 458 is coupled to the feedback input 426 of the second amplifier 408. In this manner, the second amplifier 408 and the second class-AB amplifier 406 are coupled in a unity gain configuration.

The current source 414 includes a first current mirror 460 and a second current mirror 462, a first p-channel current source 464 and a second p-channel current source 466, and a first n-channel current source 468 and a second n-channel current source 470. The first current mirror 460 includes a first n-channel transistor 472 and second n-channel transistor 474. The gate of the first n-channel transistor 472 is shorted to the drain of the first n-channel transistor 472 in a well-known current mirror configuration which ensures that the n-channel transistors 472, 474 conduct substantially the same current. Similarly, the second current mirror 462 includes a first n-channel transistor 476 and a second n-channel transistor 478. The gate and drain of the first n-channel transistor 476 are shorted and common with the gate of the second n-channel transistor 478, ensuring that the respective currents conducted by the n-channel transistors 476, 478 are substantially identical.

The first p-channel current source 464 has a gate coupled to the first output 438 of the first amplifier 404 and a drain coupled to the first n-channel transistor 472 of the first current mirror 460. Thus, the first p-channel current source 464 establishes a current in response to the signal received from the first output 438, and this reference current is conducted by the first n-channel transistor 472 of the first current mirror 460 and mirrored in the second n-channel transistor 474. Similarly, the second p-channel current source 466 has a gate coupled to the first output 444 of the second amplifier 408. The second p-channel current source 466 establishes a current, and this current is conducted by the first n-channel transistor 476 of the second current mirror 462 and mirrored in the second n-channel transistor 478.

The first n-channel current source 468 has a gate coupled to the second output 440 of the first amplifier 404. Thus, the first n-channel current source 468 establishes a current in response to the signal received from the first output 440. Similarly, the second n-channel current source 470 has a gate coupled to the second output 446 of the second amplifier 408. The second n-channel current source establishes a current in response to the signal received from the second output 446.

The current source 414 has a first current output 480 for providing a first output current and a second current output 482 for providing a second output current. The drain of the first n-channel current source 468 and the drain of the second n-channel transistor 478 of the second current mirror 462 are coupled to the first current output 480. The drain of the second n-channel current source 470 and the drain of the second n-channel transistor 474 of the first current mirror 460 are coupled to the second current output 482. The current source 414 thus provides a first output current at the first current output 480 and a second output current at the second current output 482. The first current is the sum of the drain current of the first n-channel current source 468 and the drain current of the first n-channel transistor 478.

The current attenuator 416 includes a first NPN transistor 484, a second NPN transistor 486, a third NPN transistor 488 and a fourth NPN transistor 490. The current attenuator 416 has a first input 491 coupled to the first current output 480 of the current source 414 and a second input 492 coupled to the second current output 482 of the current source 414. The current attenuator 416 further includes a first attenuator output 493 for providing a first attenuated current, a second attenuator output 494 for providing a second attenuated current, and a tuning input 495. The tuning input 495 is configured to receive a tuning signal which may be a differential tuning signal.

The first NPN transistor 484 and the second NPN transistor 486 have bases coupled to the tuning input, to receive the differential tuning signal, and emitters coupled in common to the first input 491. The collector of the second NPN transistor 486 is coupled to the first attenuator output 493. Similarly, the third NPN transistor 488 and the fourth NPN transistor 490 have bases coupled to the tuning input 495, to receive the differential tuning signal, and emitters commonly coupled to the second input 492. The collector of the third NPN transistor 488 is coupled to the second attenuator output 494.

The current attenuator 416 has the following transfer characteristic relating the first attenuated current at the first attenuator output 493 to the current at the first input 491 and relating the second attenuated current at the second attenuator output 494 to the current at the second input 492:

$$I_{out} = I_{in} \times f(V_{tune}), \text{ where } 0 < f(V_{tune}) \leq 1$$

In this transfer characteristic, $f(V_{tune})$ is an arbitrary function determined according to the performance requirements of the OTA 400.

The current mirror 418 includes a first p-channel transistor 496 and a second p-channel transistor 497. The gate and drain of the first p-channel transistor 496 are commonly coupled to the gate of the second p-channel transistor 497 in a well-known current mirror configuration. Thus, the current mirror 418 operates to sum the currents received from the first attenuator output 493 and the second attenuator output 494 of the current attenuator 416. The drain of the second p-channel transistor 497 is coupled to amplifier output 498, which is the output of the amplifier 400 for providing an output signal.

In operation, the amplifier 400 receives a differential input signal at first amplifier input 428 and second amplifier input 430. Since the first amplifier 404 and the first class AB amplification stage 406, as well as the second amplifier 408 and the second class AB amplification stage 410, are each coupled in a unity gain configuration, the signals at output 452 and output 458 is substantially identical to the differential input signal. In this manner, the differential input voltage produces differential transfer currents in the resistor 412. The resistor 412 sets the transconductance $g_m$ of the amplifier and the differential transfer currents are substantially equal to the differential input voltage divided by the resistance of the resistor 412.

The differential transfer currents in the amplifier 400 are made up of a "sinking" current component in n-channel transistors 450 and 456 and a "sourcing" current component in p-channel transistors 448 and 454. The sinking current component in n-channel transistor 450 is mirrored in first n-channel current source 468 because their respective gate-to-source voltages are substantially equal. Similarly, the sinking current component in the n-channel transistor 456 is mirrored in the second n-channel current source 470, for the same reason. The sinking current component in first n-channel current source 468 is provided to the first current output 480. The sinking current component in second n-channel current source 470 is provided to the second current output 482. The sourcing current component in p-channel transistor 448 is mirrored in the first p-channel current source 464 and the sourcing current component in the p-channel transistor 454 is mirrored in the second p-channel current source 466. Since the current conducted by the first p-channel current source 464 is also conducted by the first n-channel transistor 472 of the first current mirror 460, this sourcing current component is mirrored to the second n-channel transistor 474 and provided to the second current output 482 of the current source 414. In a like manner, the reference current established by the second p-channel current source 466 is conducted in the first n-channel transistor 476 of the second current mirror 462 and mirrored to the second n-channel transistor 478. This sourcing current component is conveyed to the first current output 480 of the current source 414.

At the first current output 480, the sinking current component from the first n-channel current source 468 is summed with the sourcing current component from the second n-channel transistor 478 of the second current mirror 462. At the second current output 482, the sinking current component from the second n-channel current source 470 is summed with the sourcing current component from the second n-channel transistor 474 of the first current mirror 460. Use of the push-pull amplifiers of the class-AB amplifiers 406, 410 allows the nominal bias current level in the class-AB amplifier transistors and the current mirror transistors to be much lower than that needed by the prior art class-A amplifier design illustrated in FIG. 3.

The current attenuator 416 attenuates the currents received at the inputs 491, 492 according to the tuning signal received at the tuning input 495. Provision of an appropriate tuning signal, for example from a simple logarithmic scaling circuit is well within the purview of those ordinarily skilled in the art.

Figure 5:
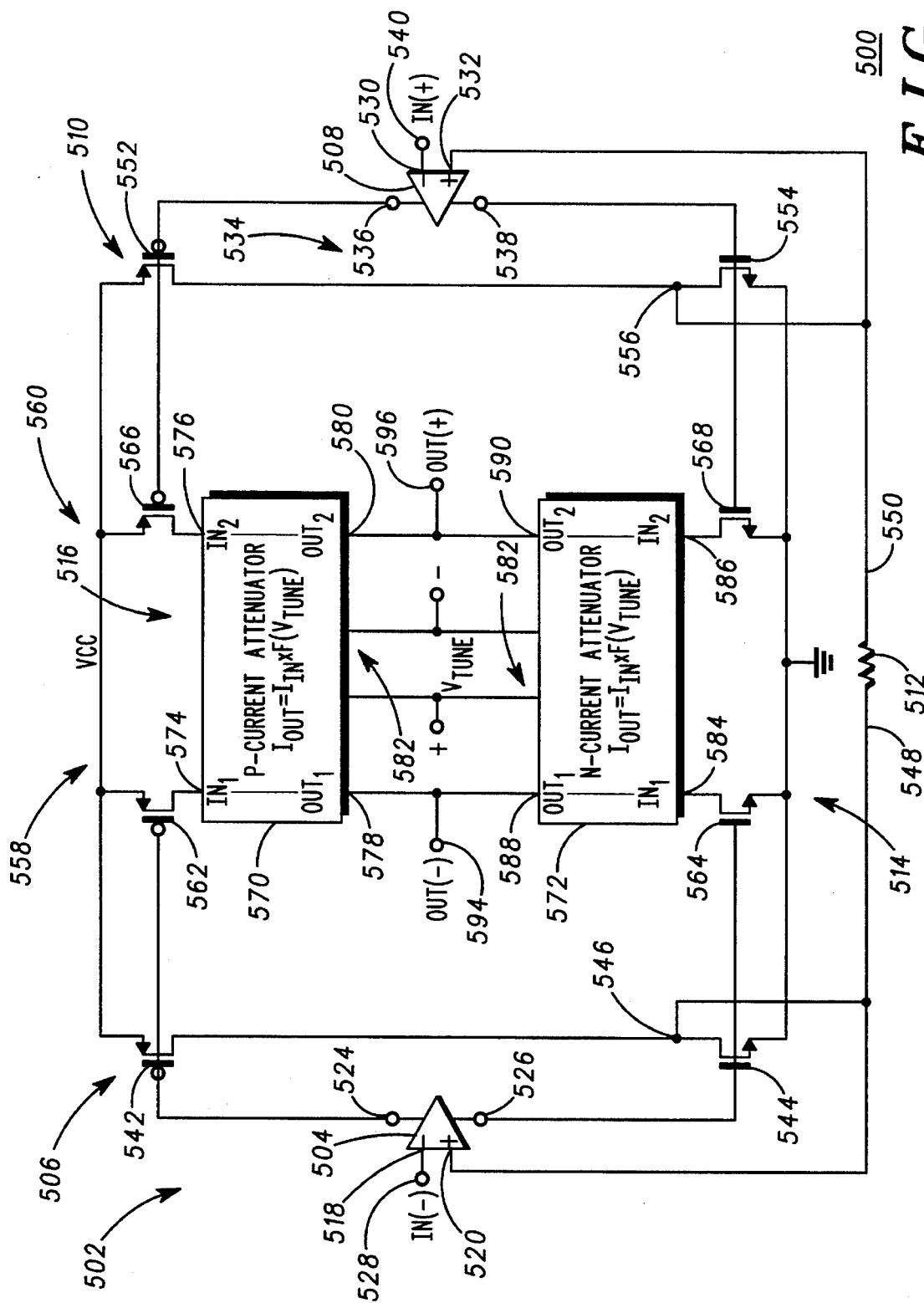
FIG. 5 is a circuit diagram in partial block diagram form illustrating an operational transconductance amplifier according to the present invention.

FIG. 5 is a circuit diagram in partial block diagram form illustrating an operational transconductance amplifier 500 according to the present invention. The amplifier 500 is a fully-differential implementation of a class-AB operational transconductance amplifier. The amplifier 500 includes an input stage 502 including a first amplifier or amplification stage 504, a first push-pull amplifier or class-AB amplification stage 506, a second amplifier or amplification stage 508 and a second push-pull amplifier or class-AB amplification stage 510. The amplifier 500 further includes a resistor 512, a current source 514 and a current attenuator 516.

The first amplifier 504 includes a first input 518, a feedback input 520 and a differential output 522 including a first output 524 and a second output 526. The first input 518 is coupled to a first amplifier input 528 of the amplifier 500. The second amplifier 508 includes a first input 530, a feedback input 532 and a differential output 534 including a first output 536 and a second output 538. The first input 530 is coupled to the second amplifier input 540 of the amplifier 500. The first amplifier input 528 and the second amplifier input 540 provide a differential input configured to receive a differential input signal.

The first class-AB amplification stage 506 includes a p-channel transistor 542 and an n-channel transistor 544. The p-channel transistor 542 has a gate coupled to the first output 524 of the first amplifier 504 and the n-channel transistor 544 has a gate coupled to the second output 526 of the first amplifier 504 for receiving a differential output signal from the first amplifier 504. The drain of the p-channel transistor 542 and the drain of the n-channel transistor 544 are coupled together at the output 546 of the first class-AB amplifier 506. The output 546 of the first class-AB amplifier 506 is coupled to a first end 548 of the resistor 512 and to the feedback input 520 of the first amplifier 504.

The second class-AB amplification stage 510 includes a p-channel transistor 552 and an n-channel transistor 554. The p-channel transistor 552 has a gate coupled to the first output 536 of the second amplifier 508 and the n-channel transistor 554 has a gate coupled to the second output 538 of the second amplifier 508 to receive the differential output signal from the second amplifier 508. The drain of the p-channel transistor 552 is coupled to the drain of the n-channel transistor 554 and both drains are coupled to the output 556 of the second class-AB amplifier 510. The output 556 is coupled to the second end 550 of the resistor 512 and to the feedback input 532 of the second amplifier.

The current source 514 includes a first complementary transistor pair 558 and a second complementary transistor pair 560. The first complementary transistor pair includes a p-channel transistor 562 and an n-channel transistor 564. The p-channel transistor 562 has a gate coupled to the first output 524 of the first amplifier 504 and n-channel transistor 564 has a gate coupled to the second output 526 of the first amplifier 504 for receiving the first differential output signal from the differential output 522. The second complementary transistor pair 560 includes a p-channel transistor 566 and an n-channel transistor 568. The p-channel transistor 566 has a gate coupled to the first output 536 of the second amplifier 508 and the n-channel transistor 568 has a gate coupled to the second output 538 of the second amplifier 508 for receiving the differential output signal from the differential output 534.

The current attenuator 516 includes a positive current attenuator 570 and a negative current attenuator 572. The p-current attenuator 570 has a first input 574 coupled to the drain of the p-channel transistor 562 and a second input 576 coupled to the drain of the p-channel transistor 566. Then-current attenuator 572 has a first input 584 coupled to the drain of the n-channel transistor 564 and a second input 586 coupled to the drain of the n-channel transistor 568. The p-current attenuator 570 further includes a first output 578 and a second output 580. The n-current attenuator 572 includes a first output 588 and a second output 590. The first output 578 of the p-current attenuator 570 and the first output 588 of the n-current attenuator 572 are coupled together and to negative amplifier output 594. The second output 580 of the p-current attenuator 570 and the second output 590 of the n-current attenuator 572 are coupled together and to positive amplifier output 596. The negative amplifier output 594 and the positive amplifier output 596 together provide a differential amplification output for the amplifier 500 for providing a differential output signal.

In operation, the amplifier 500 receives a differential input signal at amplifier inputs 528, 540. In response to the differential input signal, sourcing current components are established in the p-channel transistors 542, 552 and sinking current components are established in the n-channel transistors 544 and 554. These current components are mirrored in the p-channel transistors 562, 566 and the n-channel transistors 564, 568, respectively. The current source transistors, p-channel transistors 562, 566 and n-channel transistors 564, 568 provide output currents to the current attenuator 516 in response to the differential output signals from the differential output 522, 534. The current attenuator 516 attenuates the output currents in response to the received tuning signal and provides output currents which are summed and provided to the amplifier outputs 594, 596 as an output signal.

Figure 6:
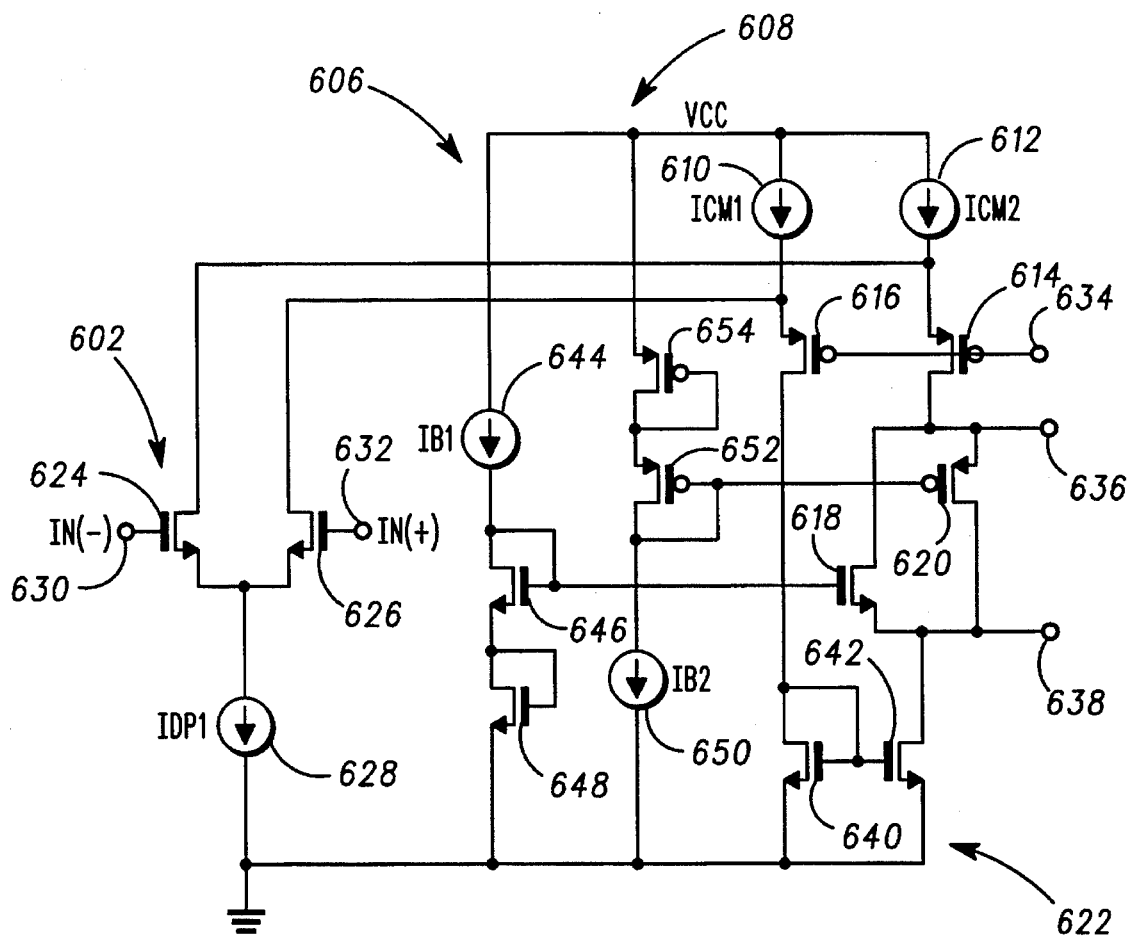
FIG. 6 is a circuit diagram illustrating an amplifier circuit for use with the operational transconductance amplifier circuits of FIGS. 4 and 5.

FIG. 6 is a circuit diagram illustrating an amplifier circuit 600 which may be used in conjunction with the operational transconductance amplifier circuits of FIGS. 4 and 5. The amplifier circuit 600 may be used for the first and second amplifiers 404, 408 (FIG. 4) and the first and second amplifiers 504, 508 (FIG. 5). The amplifier 600 includes a differential input pair 602, a first bias circuit 606, a second bias circuit 608, a first current source 610, a second current source 612, a first cascode transistor 614, a second cascode transistor 616, a first current source transistor 618, a second current source transistor 620 and a current mirror 622.

The differential input pair 602 includes a first n-channel transistor 624 and a second n-channel transistor 626 and a current source 628. The first n-channel transistor 624 has a gate coupled to an amplifier input 630 and the second n-channel transistor 626 has a gate coupled to a second amplifier input 632 for receiving a differential input signal at the first and second amplifier inputs 630, 632. The drain of the first n-channel transistor 624 is coupled to the source of the first cascode transistor 614. The drain of the second n-channel transistor 626 is coupled to the source of the second cascode transistor 616. The first and second cascode transistors 614, 616 each have a gate commonly coupled to a bias input 634 for receiving a bias signal.

The first current source 610 is coupled to the source of the second cascode transistor 616 to provide a bias current. Similarly, the second current source 612 is coupled to the source of the first cascode transistor 614 to provide a bias current. The drain of the first cascode transistor 614 is coupled to a first amplifier output 636. The first current source transistor 618 has a drain coupled to the first amplifier output 636 and a source coupled to a second amplifier output 638. The second current source transistor 620 has a source coupled to the first amplifier output 636 and a drain coupled to the second amplifier output 638.

The current mirror 622 includes a first n-channel transistor 640 and a second n-channel transistor 642. The first n-channel transistor 640 has a drain and gate commonly coupled to the gate of the second n-channel transistor 642 in a well-known current mirror configuration. The drain of the first n-channel transistor 640 is coupled to the drain of the second cascode transistor 616. The drain of the second n-channel transistor 642 is coupled to the source of the first current source transistor 618.

The first bias circuit 606 includes a current source 644, a first n-channel transistor 646 and a second n-channel transistor 648. The current source 644 provides a substantially invariant reference current. This current is conducted by the first n-channel transistor 646 and the second n-channel transistor 648 and is mirrored to the first current source transistor 618. This current establishes a bias current in the first current source transistor 618.

The second bias circuit 608 includes a current source 650, a first p-channel transistor 652 and a second p-channel transistor 654. The current source 650 provides a substantially invariant reference current. This current is conducted by the first p-channel transistor 652 and the second p-channel transistor 654 and is mirrored in the second current source transistor 620. This current establishes a bias current in the second current source transistor 620.

The amplifier 600 uses a folded cascode topology which employs the n-channel differential pair 602 and p-channel cascode transistors 614, 616. The current mirror 622 sums the currents from the differential input pair 602. The first bias circuit 606 drives the first current source transistor 618 and the second bias circuit 608 drives the second current source transistor 620.

When used in conjunction with the OTA 400 (FIG. 4) or the OTA 500 (FIG. 5), the respective sources of the first current source transistor 618 and the second current source transistor 620 bias the gates of the n-channel and p-channel transistors forming the push-pull amplifier or class AB amplification stages 406, 410 (FIG. 4) and 506, 510 (FIG. 5). Variations in the differential output voltage received at the amplifier inputs 630, 632 cause variations in the bias level established by the amplifier 600 at the amplifier outputs 636, 638.

As can be seen from the foregoing, the present invention provides an operational transconductance amplifier with reduced static current dissipation and improved dynamic performance. The operational transconductance amplifier has an input amplification stage including a push-pull or class AB output stage which establishes differential currents in the $g_m$ setting resistor without the need for a static current source. Circuit performance and parameters can be optimized using well-known techniques such as varying transistor conductances, for example, by varying transistor sizes.

While a particular embodiment of the present invention has been shown and described, modifications may be made. For example, the current attenuator may be omitted from the operational transconductance amplifier and other types of current summing circuits may be substituted. Similarly, other types of input amplifiers may be used for receiving the differential input signal and establishing the biasing levels for the push-pull amplifiers. It is therefore intended in the appended claims to cover all such changes and modifications which fall within the true spirit and scope of the invention.

What is claimed is:

1. An operational transconductance amplifier comprising:

an input stage configured to receive a differential input signal, the input stage including:

an amplification stage having a first input and a second input for receiving the differential input signal and a first differential output for providing a first differential output signal and a second differential output for providing a second differential output signal;

a class-AB amplification stage including a first class-AB amplifier coupled to the first differential output for receiving the first differential output signal and a second class-AB amplifier coupled to the second differential output for receiving the second differential output signal, the first class-AB amplifier having an output coupled to the first input of the amplification stage in a unity gain configuration and the second class-AB amplifier having an output coupled to the second input of the amplification stage in a unity gain configuration;

a resistive element coupled between the output of the first class-AB amplifier and the output of the second class-AB amplifier;

a current source having a first input coupled to the first differential output for receiving the first differential output signal and a second input coupled to the second differential output for receiving the second differential output signal, the current source further including a first current output and a second current output, the current source providing a first output current at the first current output in response to the first differential output signal and a second output current at the second current output in response to the second differential output signal; and a current summer coupled to the first current output and the second current output for summing the first output current and the second output current and providing an output signal.

2. An operational transconductance amplifier as defined in claim 1 wherein the current summer comprises a current mirror coupled to the first current output and the second current output for summing the first output current and the second output current.

3. An operational transconductance amplifier as defined in claim 2 wherein the current summer further comprises a current attenuator having a first input coupled to the first current output for receiving the first output current and a second input coupled to the second current output for receiving the second output current, the current attenuator further including a first attenuator output for providing a first attenuated current in response to the first output current and a second attenuator output for providing a second attenuated current in response to the second output current, the current mirror being coupled to the first attenuator output and the second attenuator output for summing the first attenuated current and the second attenuated current and providing the output signal.

4. An operational transconductance amplifier as defined in claim 3 wherein the current attenuator further includes a tuning input for receiving a tuning signal, the current attenuator attenuating the first output current and the second output current in response to the tuning signal to provide the first attenuated current and the second attenuated current.

5. An operational transconductance amplifier as defined in claim 1 wherein the current source includes a first complementary transistor pair and a second complementary transistor pair, the first complementary transistor pair including a p-channel transistor and an n-channel transistor, the p-channel transistor and the n-channel transistor having respective gates coupled to the first differential output for receiving the first differential output signal, the p-channel transistor and the n-channel transistor having respective drains, the second complementary transistor pair including a p-channel transistor and an n-channel transistor, the p-channel transistor and the n-channel transistor having respective gates coupled to the second differential output for receiving the second differential output signal, the p-channel transistor and the n-channel transistor having respective drains, and wherein the current summer comprises a current attenuator coupled to the drain of the p-channel transistor of the first complementary transistor pair and the drain of the p-channel transistor of the second complementary transistor pair, the current attenuator further coupled to the drain of the n-channel transistor of the first complementary transistor pair and the drain of the n-channel transistor of the second complementary transistor pair, the current attenuator including an attenuator output for providing the output signal.

6. An operational transconductance amplifier as defined in claim 1 wherein the current source comprises a first current mirror and a second current mirror, the first current mirror being coupled to the first differential output for producing a first output current at the first current output in response to the first differential output signal, the second current mirror being coupled to the second differential output for producing a second output current at the second current output in response to the second differential output signal.

7. An operational transconductance amplifier as defined in claim 6 wherein the first and second current mirrors have first and second inputs respectively and wherein the current source further comprises a first p-channel current source coupled to the first input of the first current mirror and a second p-channel current source coupled to the second input of the second current mirror for establishing respective currents in the first and second current mirrors in response to the first differential output signal and the second differential output signal, respectively, and wherein the current source further includes a first n-channel current source coupled to the first current output for establishing the first output current and a second n-channel current source coupled to the second current output for establishing the second output current, the first current mirror having an output coupled to the second current output and the second current mirror having an output coupled to the first current output.

8. An operational transconductance amplifier having a differential input including a first amplifier input and a second amplifier input, and an amplifier output, the operational transconductance amplifier comprising:

a resistor having a first end and a second end;

a first amplifier including:

a first amplification stage having a first input coupled to the first amplifier input, a feedback input, and an output;

a first push-pull amplifier having an input coupled to output of the first amplification stage and an output coupled to the feedback input of the first amplification stage and to the first end of the resistor;

a first current source having an input coupled to the output of the first amplification stage and a first current output, the first current source providing a first output current at the first current output in response to a signal received at the input of the first current source;

a second amplifier including:

a second amplification stage having a first input coupled to the second amplifier input, a feedback input, and an output;

a second push-pull amplifier having an input coupled to the output of the second amplification stage and an output coupled to the feedback input of the second amplifier stage and to the second end of the resistor;

a second current source having an input coupled to the output of the second amplification stage and a second current output, the second current source providing a second output current at the second current output in response to a signal received at the input of the second current source;

a current attenuator having a first input coupled to the first current output and a second input coupled to the second current output, a first attenuator output and a second attenuator output, the current attenuator providing a first attenuated current at the first attenuator output in response to the first output current received at the first input and providing a second attenuated current at the second attenuator output in response to the second output current received at the second input; and current mirror coupled to the amplifier output, the first attenuator output and the second attenuator output, the current mirror summing the first attenuated current and the second attenuated current and providing the output signal to the amplifier output.

9. An operational transconductance amplifier as defined in claim 8 wherein the first push-pull amplifier comprises a first transistor having a first gate and a first drain and a second transistor having a second gate and a second drain, the first drain and the second drain being coupled to the output of the first push-pull amplifier, and wherein the first amplification stage includes a positive output and a negative output coupled to the first gate and the second gate, respectively.

10. An amplifier circuit configured to provide an output signal in response to a differential input signal, the amplifier circuit comprising:

a differential input stage having a first input and a second input for receiving the differential input signal and a first differential output and a second differential output;

a push-pull amplifier stage including a first push-pull amplifier having a first push-pull amplifier input coupled to the first differential output and a second push-pull amplifier having a second push-pull amplifier input coupled to the second differential output, the first push-pull amplifier having a first push-pull amplifier output coupled to the first input of the differential input stage and the second push-pull amplifier having a second push-pull amplifier output coupled to the second input of the differential input stage;

a resistor coupled between the first push-pull amplifier output and the second push-pull amplifier output;

a current source having a first current source input coupled to the first differential output and a second current source input coupled to the second differential output, a first current output and a second current output, the current source providing a first output current at the first current output in response to a signal received at the first current source input and providing a second output current at the second current output in response to a signal received at the second current input; and an output stage having a first input coupled to the first current output and a second input coupled to the second current output, and an output for providing the output signal.

11. An amplifier circuit as recited in claim 10 wherein the output stage comprises a current summer coupled to the first current output and the second current output for summing the first output current and the second output current to provide the output signal.

12. An amplifier circuit as recited in claim 11 wherein the output stage further comprises a current attenuator coupled between the first and second current outputs and the current summer for attenuating the first current and the second current and providing a first attenuated current and a second attenuated current to the current summer, the current summer summing the first attenuated current and the second attenuated current to provide the output signal.

13. An amplifier circuit as recited in claim 10 wherein the amplifier circuit includes a first feedback input and a second feedback input and wherein each respective push-pull amplifier comprises a respective p-channel transistor and a respective n-channel transistor, each respective n-channel transistor having a respective gate coupled to the second differential output, each respective p-channel transistor having a respective gate coupled to the first differential output, and each respective n-channel transistor having a respective drain coupled to a respective feedback input and each respective p-channel transistor having a respective drain coupled to a respective feedback input.

14. An operational transconductance amplifier configured to receive a differential input signal and provide an output signal in response to the differential input signal, the operational transconductance amplifier comprising:

an input amplification stage including a first input amplifier having a first signal input and a first feedback input and a second input amplifier having a second signal input and a second feedback input, the input amplification stage being configured to receive the differential input signal at the first signal input and the second signal input and provide a feedback signal in response to the differential input signal, the input amplification stage further including a first class-AB output stage including a first upper transistor coupled to the first feedback input for providing a first feedback signal to the first feedback input in response to a first upper gate control signal and a first lower transistor coupled to the first feedback input for providing the first feedback signal in response to a first lower gate control signal, the input amplification stage further including a second class-AB output stage including a second upper transistor coupled to the second feedback input for providing a second feedback signal in response to a second upper gate control signal and a second lower transistor coupled to the second feedback input for providing the second feedback signal in response to a second lower gate control signal;

a resistive element coupled between the first feedback input and the second feedback input;

a current source coupled to the input amplification stage, the current source including a first current output and a second current output, the current source including a first current source lower transistor coupled to the first current output and a first current source upper transistor coupled to the first current output for providing a first output current to the first current output in response to the first lower gate control signal and the first upper gate control signal, respectively, and a second current source lower transistor coupled to the second current output and a second current source upper transistor coupled to the second current output for providing a second output current to the second current output in response to the second lower gate control signal and the second upper gate control signal, respectively; and an output current mirror coupled to the first current output and the second current output, the output current mirror summing the first output current and the second output current and producing the output signal.

15. An operational transconductance amplifier as recited in claim 14 wherein the current source further comprises a first current mirror including a first n-channel transistor having a common gate and drain connection, the drain being electrically coupled to the first current source upper transistor, the first current mirror further including a second n-channel transistor having a gate coupled to the gate of the first n-channel transistor and a drain coupled to the second current output, the current source further including a second current mirror including a first n-channel transistor having a common gate and drain connection, the drain being electrically coupled to the drain of the second current source upper transistor, the second current mirror further including a second n-channel transistor having a gate coupled to the gate of the first n-channel transistor and a drain coupled to the first current output.

16. An operational transconductance amplifier as recited in claim 15 wherein the first current source upper transistor establishes a first reference current in the first n-channel transistor of the first current mirror, the first reference current-being further established in the second n-channel transistor of the first current mirror and provided to the first current output, and wherein the second current source upper transistor establishes a second reference current in the first n-channel transistor of the second current mirror, the second reference current being further established in the second n-channel transistor of the second current mirror and provided to the second current output.

17. An operational transconductance amplifier as recited in claim 14 wherein first current output comprises a first positive current output and a first negative current output, and wherein the second current output comprises a second positive current output and a second negative current output, and wherein the current attenuator includes a positive current attenuator having inputs coupled to the first positive current output and the second positive current output and a positive current output, and the current attenuator further includes a negative current attenuator having inputs coupled to the first positive current output and the second positive current output, the current attenuator further including a negative current output coupled to the positive current output for producing the output signal.

* * * * *